United States Patent [19]

Ichiyoshi

[11] Patent Number: 5,291,144

[45] Date of Patent: Mar. 1, 1994

[54] PHASE-LOCKED CIRCUIT CAPABLE OF BEING QUICKLY PUT IN A PHASE-LOCKED STATE

[75] Inventor: Osamu Ichiyoshi, Tokyo, Japan

[73] Assignee: NEC Corporation, Japan

[21] Appl. No.: 954,656

[22] Filed: Sep. 30, 1992

[30] Foreign Application Priority Data

Sep. 30, 1991 [JP] Japan .................. 3-250731
Sep. 30, 1991 [JP] Japan .................. 3-250738

[51] Int. Cl.$^5$ .................. H03K 5/13; H03K 5/22
[52] U.S. Cl. .................. 328/155; 307/262; 331/1 R; 375/120
[58] Field of Search .................. 328/155, 63, 72; 307/262, 269; 375/118, 119, 120; 331/1 R, 25

[56] References Cited

U.S. PATENT DOCUMENTS 4,816,775  3/1989  Ryan .................. 331/25
5,119,037  6/1992  Ichiyoshi .................. 328/155

FOREIGN PATENT DOCUMENTS 3119448  9/1982  Fed. Rep. of Germany .

*Primary Examiner*—Timothy P. Callahan
*Attorney, Agent, or Firm*—Ostrolenk, Faber, Gerb & Soffen

[57] ABSTRACT

In a phase-locked circuit which is operable in response to an input complex signal to produce an output complex signal, a first complex multiplication is carried out between the input and the output complex signals to obtain a phase difference therebetween which appears as a complex phase difference. The complex phase difference is composed of a real part and an imaginary part which are individually allowed to pass through a low pass filter and to be supplied to a numerically controlled oscillator as a control signal. The control signal includes a frequency component even when the phase-locked circuit is put into an asynchronous state. The low pass filter may be replaced by a digital circuit comprising phase dividers.

3 Claims, 5 Drawing Sheets

PHASE-LOCKED CIRCUIT CAPABLE OF BEING QUICKLY PUT IN A PHASE-LOCKED STATE

BACKGROUND OF THE INVENTION

This invention relates to a phase-locked circuit for use in responding to a sequence of input sample signals to produce a sequence of output sample signals phase-locked with the input sample signals.

A conventional phase-locked circuit of the type described has been usually implemented by a phase-locked loop (PLL) circuit which comprises a phase comparator (namely, a mixer), a low pass filter (LPF), and a voltage controlled oscillator (VCO). With this structure, the mixer is supplied with a sequence of input sample signals carried by an input carrier frequency together with a local carrier signal generated by the voltage controlled oscillator. The local carrier signal has a local carrier frequency. The mixer produces a phase difference signal representative of a phase difference between the input carrier frequency and the local carrier frequency. The phase difference signal is filtered by the low pass filter into a filtered difference signal and is thereafter sent to the voltage controlled oscillator. As a result, a phase of the local carrier signal is controlled so as to be phase-locked with a phase of the input carrier signal in accordance with the phase difference in the voltage controlled oscillator.

Herein, it often happens that the filtered difference signal includes a frequency component such that the frequency component falls outside of a pull-in range of the phase-locked loop circuit. In this event, the phase-locked loop circuit is put into an inactive state. In other words, a phase lock operation can not be accomplished in the conventional phase-locked loop circuit as long as the filtered difference signal does not fall within the pull-in range. This means that the phase-locked loop circuit can be put in an asynchronous state while the local carrier frequency is not close to the input carrier frequency. This makes a quick phase lock operation difficult and brings about retardation of the phase lock operation.

Recently, consideration is made about a digital phase-locked circuit which carries out a phase lock operation by digitally processing input complex sample signals each of which is divisible into a real component and an imaginary component orthogonal to the real component. In this event, only one of the real and the imaginary components is derived from the input complex sample signal and is successively sent from a mixer to an integrator through an adder. The integrator is formed by a delay unit which delays each imaginary component by a single sample period to produce a delayed component which is fed back to the adder to be added to the following component on one hand and which is also fed back to the mixer to be mixed with the following imaginary component. With this structure, it is possible to carry out a phase lock operation like in the conventional phase-locked loop circuit which comprises the voltage controlled oscillator, as mentioned above.

However, a long time is also required in the digital phase-locked circuit until a phase-locked state is accomplished.

SUMMARY OF THE INVENTION

It is an object of this invention to provide a phase-locked circuit which is capable of being quickly put into a phase-locked state.

It is another object of this invention to provide a phase-locked circuit of the type described, which is capable of being widely used.

A phase-locked circuit to which this invention is applicable is for use in responding to a sequence of input complex sample signals to produce a sequence of output complex sample signals phase-locked with the input complex sample signals. Each of the input and the output complex sample signal sequences is produced at every sample period and is carried by a complex carrier wave divisible into a real component and an imaginary component orthogonal to the real component. According to this invention, the phase-locked circuit comprises a first complex multiplication circuit which has a pair of first input terminals, a pair of second input terminals, and a pair of output terminals and which are supplied with the input complex sample signals and a sequence of local complex sample signals through the first and the second input terminal pairs, respectively, for carrying out a first complex multiplication between the input and the local complex sample signals to produce, through the output terminal pair, first complex multiplication result signals representative of results of the first complex multiplication, extraction means supplied with the first complex multiplication result signals for extracting phase differences between the input and the local complex sample signals from the first complex multiplication result signals to produce complex difference signals representative of complex phase differences between the input and the local complex sample signals, a delay circuit supplied with the local complex sample signals for delaying the output complex sample signals by a single sample period to produce delayed complex sample signals, a second complex multiplication circuit supplied with the complex difference signals and the delayed complex sample signals for carrying out a second complex multiplication between the complex difference signals and the delayed complex sample signals to produce second complex multiplication result signals representative of results of the second complex multiplication, an output limiter supplied with the second complex multiplication result signals for limiting amplitudes of the second complex multiplication result signals to produce amplitude limited signals each of which has an invariable amplitude, means for producing the amplitude limited signals as the output complex sample signals, and means for supplying the output complex sample signals to the delay circuit and the first complex multiplication circuit as the local complex sample signals.

Figure 1:
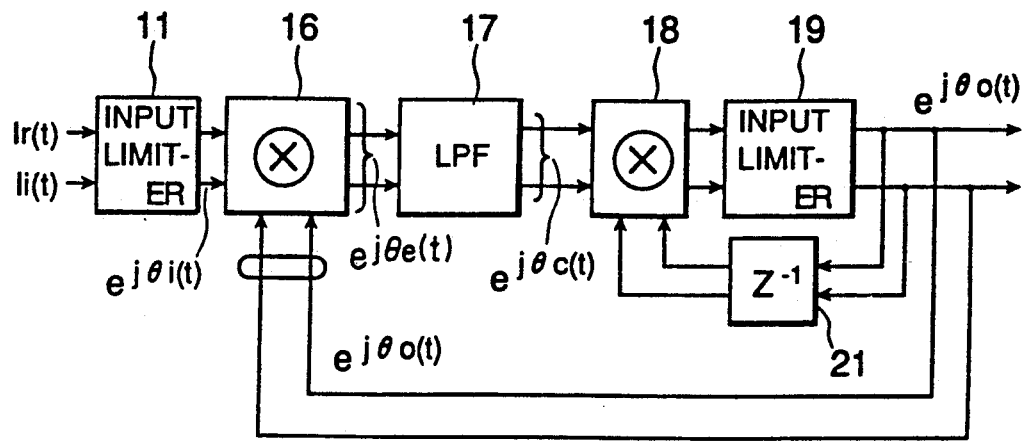
FIG. 1 is a block diagram of a phase-locked circuit according to a first embodiment of this invention.

DESCRIPTION OF THE PREFERRED EMBODIMENTS:

Referring to FIG. 1, a phase-locked circuit according to a first embodiment of this invention is given an input signal Ic(t) which is varied with time. The input signal Ic(t) is divided into an input real component Ir(t) and an input imaginary component Ii(t) orthogonal to the input real component Ir(t) and includes input complex sample signals sampled at every sample period T and carried by an input carrier frequency wave which may be referred to as a complex carrier wave having an angular frequency. In the illustrated example, the input real and the input imaginary components Ir(t) and Ii(t) are separated from each other by the use of a known circuit (not shown) connected prior to the illustrated phase-locked circuit and are carried by a sine wave and a cosine wave of the input carrier frequency wave. At any rate, the input real component Ir(t) and the input imaginary component Ii(t) are separately and individually supplied to an input limiter 11.

The input limiter 11 serves to limit each amplitude component of the input real component Ir(t) and the input imaginary component Ii(t) and to produce real and imaginary amplitude-limited signals which may be collectively called an input complex sample signal carried by the complex carrier wave. Herein, the input signal Ic is generally represented by:

$$Ic(t) = Ir(t) + jIi(t) = r \cdot e^{j\theta(t)}$$

where $Ir(t)^2 + Ii(t)^2 + r(t)^2$ and $\theta = \tan^{-2} Ii(t)/Ir(t)$ and where in turn r(t) is representative of the amplitude component.

An operation of the input limiter 11 is collectively given by:

$$Ic(t)/|Ic(t)| = r \cdot e^{j\theta(t)}/r = e^{j\theta(t)}. \quad (1)$$

As is apparent from Equation (1), it may be said that the input limiter 11 is operable to remove the amplitude component r from the input signal Ic(t) and produces a limiter output signal represented by $e^{j\theta(t)}$. Thus, the limiter output signal $e^{j\theta(t)}$ is represented by an exponential function and may be referred to as an input complex sample signal of the phase-locked circuit. In this connection, the input complex sample signal may be rewritten into $e^{j\theta i(t)}$ which are divisible into real and imaginary components of the input complex sample signal $e^{j\theta i(t)}$, respectively. The real and the imaginary components are separately sent to a first complex multiplication circuit 16 which may be called a first complex mixer.

As shown in FIG. 1, the first complex multiplication circuit 16 has a pair of first input terminals, a pair of second input terminals, and a pair of output terminals. The first input terminals are supplied with the real and the imaginary components of the input complex sample signals while the second input terminals are supplied with real and imaginary components of local complex sample signals as will be described later in detail. The local complex sample signals are also represented by an exponential function and specified by $e^{j\theta o(t)}$.

The first complex multiplication circuit 16 carries out a first complex multiplication between the input and the local complex sample signals to produce first complex multiplication result signals $e^{j\theta e(t)}$ representative of results of the first complex multiplication. The first complex multiplication is represented by:

$$e^{j\theta i(t)} \cdot e^{j\theta o(t)} = e^{j(\theta i(t) + \theta o(t))}.$$

From this fact, it is readily understood that the first complex multiplication between the input and the local complex sample signals is specified by a sum of phase components of the input and the local complex sample signals $e^{j\theta i(t)}$ and $e^{j\theta o(t)}$ and is produced through the output terminals as the first complex multiplication result signals $e^{j\theta e(t)}$.

Figure 2:
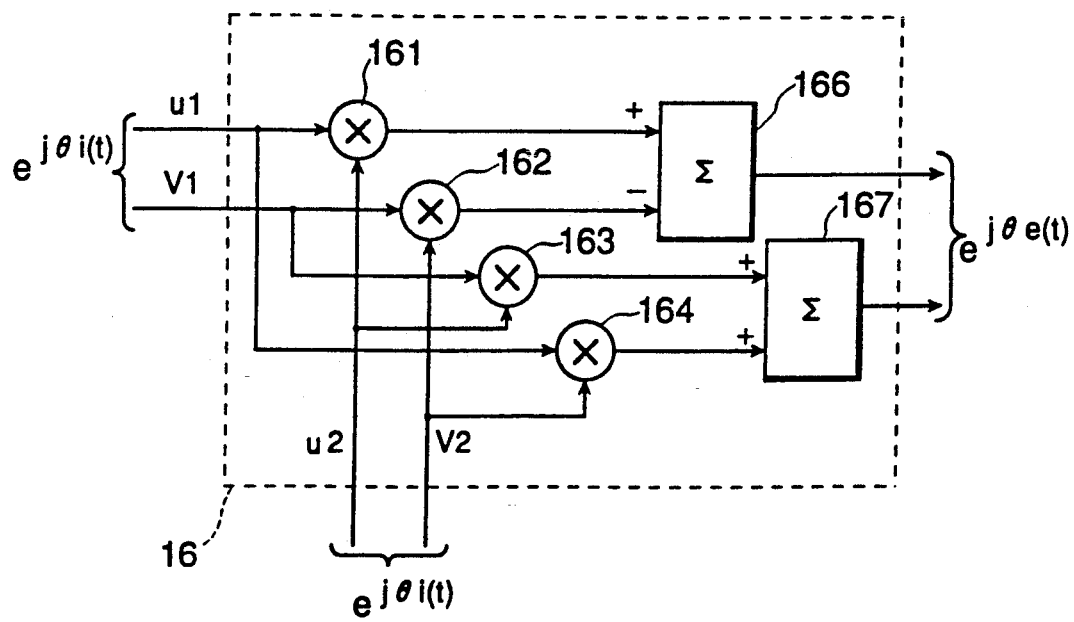
FIG. 2 is a block diagram of a complex multiplication circuit which is usable in the phase-locked circuit illustrated in FIG. 1.

Referring to FIG. 2 together with FIG. 1, a complex multiplication circuit which may be exemplified by the first complex multiplication circuit 16 generally multiplies a first complex sample signals, such as $e^{j\theta i(t)}$, by a second complex sample signal, such as $e^{j\theta o(t)}$, to calculate a complex multiplication result, such as $e^{j\theta e(t)}$. If the first and the second complex sample signals are generally represented by $\omega 1$ and $\omega 2$, their complex representations are given by:

$$\omega 1 = u1 + jv1 = e^{j\theta i(t)} \text{ and}$$

$$\omega 2 = u2 + jv2 = e^{j\theta o(t)},$$

where u1 and u2 represent real components of $\omega 1$ and $\omega 2$, respectively, and v1 and v2, imaginary components thereof.

Under the circumstances, the complex multiplication result is given by:

$$\omega 1 \cdot \omega 1 = (u1 \cdot u2 - v1 \cdot v2) + j(u1 \cdot v2 + u2 \cdot v1). \quad (2)$$

From Equation (2), it is readily understood that the complex multiplication circuit can be realized by first through fourth multipliers 161 to 164 and first and second adders 166 and 167, as illustrated in FIG. 2. In FIG. 2, the first adder 166 is operable as a substracter to calculate the first term of the righthand side of Equation (2) while the second adder 167 calculates the second term of the righthand side of Equation (2).

Referring back to FIG. 1, each of the first complex multiplication result signals $e^{j\theta e(t)}$ is supplied to a low pass filter (LPF) 17 which may be called a loop filter like in the conventional phase-locked loop (PLL) circuit. Herein, the low pass filter 17 filters the first complex multiplication signals $e^{j\theta e(t)}$. As a result, real and imaginary parts of the first complex multiplication signals are individually or separately filtered by the low pass filter 17. In this connection, the illustrated low pass filter 17 is formed by a pair of local low pass filters each of which has the same transfer function H(z) when the transfer function is represented by a z-transform. Specifically, the transfer function H(z) is given by:

$$H(z) = (1-a)/(1-az^{-1}), \quad (3)$$

where a is a constant and z is equal to $e^{j\omega T}$ and where T is representative of the sample period.

Figure 3:
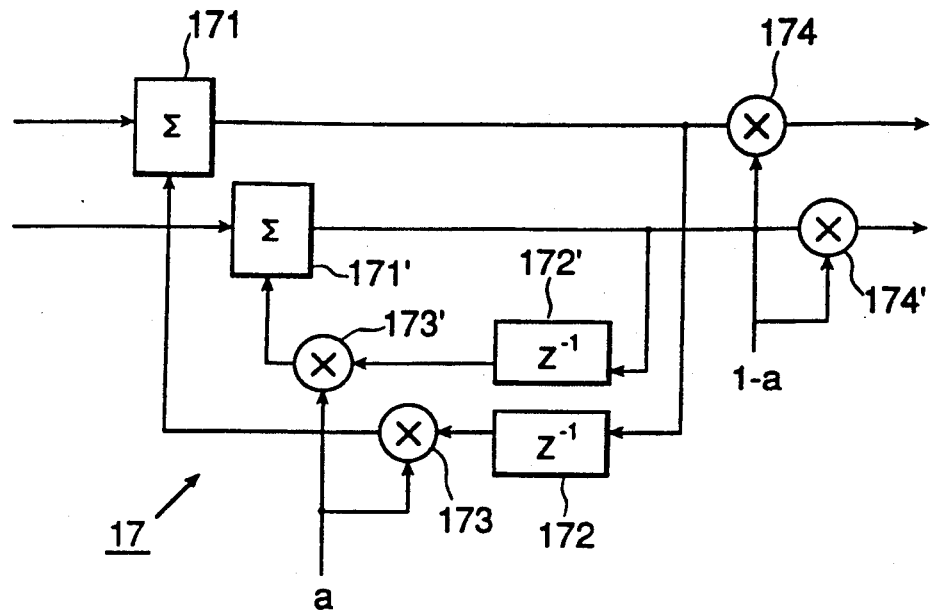
FIG. 3 shows an equivalent circuit of a low pass filter used in the phase-locked circuit illustrated in FIG. 1.

Temporarily referring to FIG. 3, the low pass filter 17 can be formed by a pair of circuits each of which has the transfer function shown by Equation (3) and which may be referred to as a real part circuit and an imaginary part circuit for filtering real and imaginary parts of the first complex multiplication result signals $e^{j\theta e(t)}$, respectively. As illustrated in FIG. 3, the real part circuit is structured by a combination of an adder 171, a delay unit 172 depicted at $z^{-1}$, a multiplier 173, and an additional multiplier 174. Likewise, the imaginary part circuit is structured by a combination of an adder 171', a delay unit 172', a multiplier 173', and an additional multiplier 174'. In order to accomplish the above-mentioned transfer function H(z), the constant a is given to each of the multipliers 173 and 173' while another constant (1−a) is given to each of the additional multipliers 174 and 174'.

Herein, it is to be noted that a frequency characteristic of the low pass filter 17 is given as a function of $j\omega$ from Equation (3) by:

$$H(j\omega) = (1-a)/(1-ae^{-j\omega T}), \qquad (4)$$

where $\omega$ is representative of an angular frequency of a natural frequency.

In Equation (4), when the sample period T is assumed to be sufficiently short, Equation (4) is rewritten into:

$$\begin{aligned} H(j\omega) &= (1-a)/(1-a+ja\omega T) \\ &= 1/(1+j\omega(aT/(1-a))) \end{aligned} \qquad (5)$$

When $\tau$ is substituted for $(aT/(1-a))$ in Equation (5), Equation (5) results in:

$$\begin{aligned} H(j\omega) &= 1/(1+j\omega\tau) \\ &= (1/\sqrt{1+\omega^2\tau^2})\, e^{-j\tan^{-1}\omega\tau} \end{aligned} \qquad (6)$$

Under the circumstances, let the low pass filter 28 be supplied with the first complex multiplication result signals $e^{j\theta e(t)}$ which may be rewritten into $e^{j(\omega_e t + \theta e)}$ where $\omega_e t$ is representative of an angular frequency and $\theta e$, an initial phase. In this event, the low pass filter 28 produces a filter output signal $Ve'(t)$ represented by:

$$\begin{aligned} Ve'(t) &= (1/\sqrt{1+\omega_e^2\tau^2}) \times \\ & \quad e^{j(\omega_e t + \theta e - \tan^{-1}\omega_e\tau)} \\ &= A \cdot e^{j\theta c(t)} \end{aligned} \qquad (7)$$

As apparent from Equation (7), the filter output signal $Ve'(t)$ has only a phase delay determined by $\tan^{-1}\omega_e\tau$. If $\tau$ is assumed to be constant, the phase delay is also invariable.

Turning back to FIG. 1, the filter output signal $Ve'(t)$ is delivered to a second complex multiplication circuit 18 which is operable in a manner similar to the first complex multiplication circuit 16. In this connection, the second complex multiplication circuit 18 has a pair of first input terminals, a pair of second input terminals, and a pair of output terminals. The filter output signal $Ve'(t)$ is given through the first input terminals to the second complex multiplication circuit 18 while delayed complex sample signals $v_d(t)$ are sent to the second complex multiplication circuit 18 through the second input terminals, as will later be described. At any rate, the second complex multiplication circuit 18 carries out a second complex multiplication between the filter output signal $Ve'(t)$ and the delayed complex sample signals and supplies an output limiter 19 through the output terminals with second complex multiplication result signals representative of results of the second complex multiplication.

The output limiter 19 limits each amplitude of the second complex multiplication result signals like the input limiter 11 to produce, as the output complex sample signals $e^{j\theta o(t)}$, amplitude limited result signals having an invariable amplitude. The output complex sample signals $e^{j\theta o(t)}$ are sent to an external device (not shown) on one hand and fed back to both a delay unit 21 and the first complex multiplication circuit 16 on the other hand. In this event, the output complex sample signals $e^{j\theta o(t)}$ are given to the first complex multiplication circuit 16 as the local complex sample signals as mentioned before and are delayed by the delay unit 21 for one sample period T to be fed back to the second complex multiplication circuit 18 as the delayed complex sample signals $v_d(t)$.

Herein, a combination of the second complex multiplication circuit 18, the output limiter 19, and the delay unit 21 may be collectively called a complex numerically controlled oscillator.

Specifically, the output complex sample signals $e^{j\theta o(t)}$ may be replaced by $v_o(t)$. In this case, the delayed complex sample signals $v_d(t)$ are represented by:

$$v_d(t) = v_o(t-T) = e^{j\theta o(t-T)}.$$

Inasmuch as the filter output signal $Ve'(t)$ is given by Equation (7), calculation of the second complex multiplication circuit 18 and the output limiter 19 is given by:

$$\begin{aligned} v_o(t) &= e^{j\theta o(t)} \\ &= ve'(t)\, v_d(t) \\ &= e^{j\theta c(t)}\, e^{j\theta o(t-T)} \end{aligned} \qquad (8)$$

It is to be noted in Equation (8) that the amplitude component A is rendered into unity by the output limiter 19 and that an output phase $\theta o(t)$ is represented by:

$$\theta o(t) = \theta c(t) + \theta o(t-T). \qquad (9)$$

In Equation (9), let the time to be varied from 0 to nT. In this event, the output phase $\theta o(t)$ is given by:

$$\theta o(nT) = \sum_{i=0}^{n} \theta c(iT). \qquad (10)$$

Accordingly, it is possible to represent the output phase of the output complex sample signals $v_o(t)$ by summation or integration of that phase of the filter output signal $Ve'(t)$ which is referred to as a control phase.

Herein, let a transfer function be calculated in connection with the complex numerically controlled oscillator. For this purpose, Equation (9) is subjected to a z-transform and is rewritten into:

$$\theta o(z) = \theta c(z) + z^{-1} \cdot \theta o(z). \qquad (11)$$

From Equation (11), the transfer function is given by:

$$\theta o(z)/\theta c(z) = 1/(1-z^{-1}). \tag{12}$$

Figure 4:
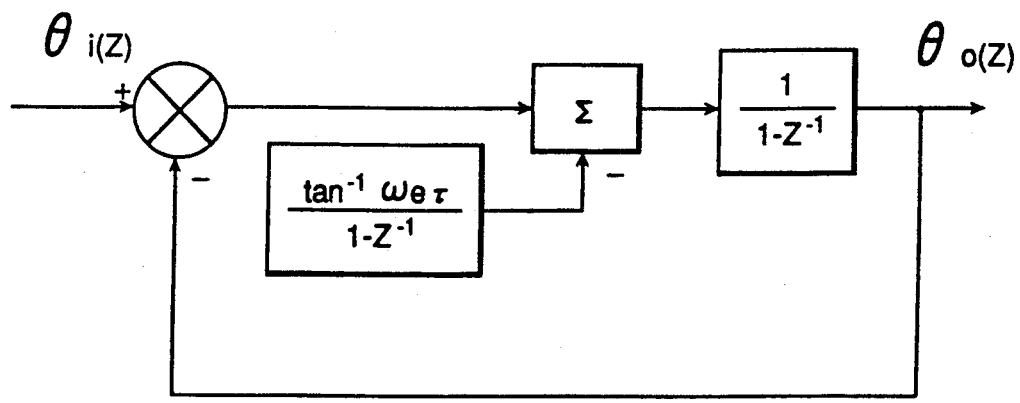
FIG. 4 shows an equivalent circuit of the phase-locked circuit illustrated in FIG. 1.

Referring to FIG. 4, the above-mentioned phase-locked circuit illustrated in FIG. 1 may be specified by an equivalent circuit of FIG. 4. The illustrated circuit has a transfer function represented by the use of a z-transform for brevity of description. In FIG. 4, it is readily understood that the phase-locked circuit can be represented by a combination of a multiplier, a subtracter, a circuit element having the transfer function of $(\tan^{-1}\omega_e T)/(1-z^{-1})$, and the complex numerically controlled oscillator having the transfer function shown by Equation (12).

According to FIG. 4, the output complex sample signals $e^{j\theta o(t)}$ can be represented by the use of the z-transform by:

$$\theta o(z) = (\theta i(z)/(2-z^{-1})) - (\tan^{-1}\omega_e T)/2-z^{-1})(1-z^{-1}))$$

where $$\theta i(z) = (\omega i T/(1-z^{-1})) + \phi i/(1-z^{-1}). \tag{13}$$

Let a phase $\theta o(m)$ of an m-th one of the output complex sample signals be calculated by the use of Equation (10). In this case, Equation (10) is rewritten into:

$$\theta o(z) = \Sigma \theta o(m)z^{-m}. \tag{14}$$

From Equation (14), $\theta o(m)$ is represented by:

$$\theta o(m) = \omega i Tm + \phi i - \tan^{-1}\omega_e T + (\omega i T)(\phi i - \tan^{-1}\omega_e T/2)(\tfrac{1}{2}^m). \tag{15}$$

In Equation (15), the last term is quickly rendered into zero because $(\tfrac{1}{2}^m)$ quickly approaches zero with time. Therefore, Equation (15) can be rewritten into:

$$\theta o(m) \to \omega i Tm + \phi i - \tan^{-1}\omega_e T. \tag{16}$$

Inasmuch as the third term on the righthand side of Equation (16) is quickly converged into zero, the output phase becomes equal to the input phase at once. Thus, phase synchronization is quickly established by the phase-locked circuit illustrated in FIG. 1.

Figure 5:
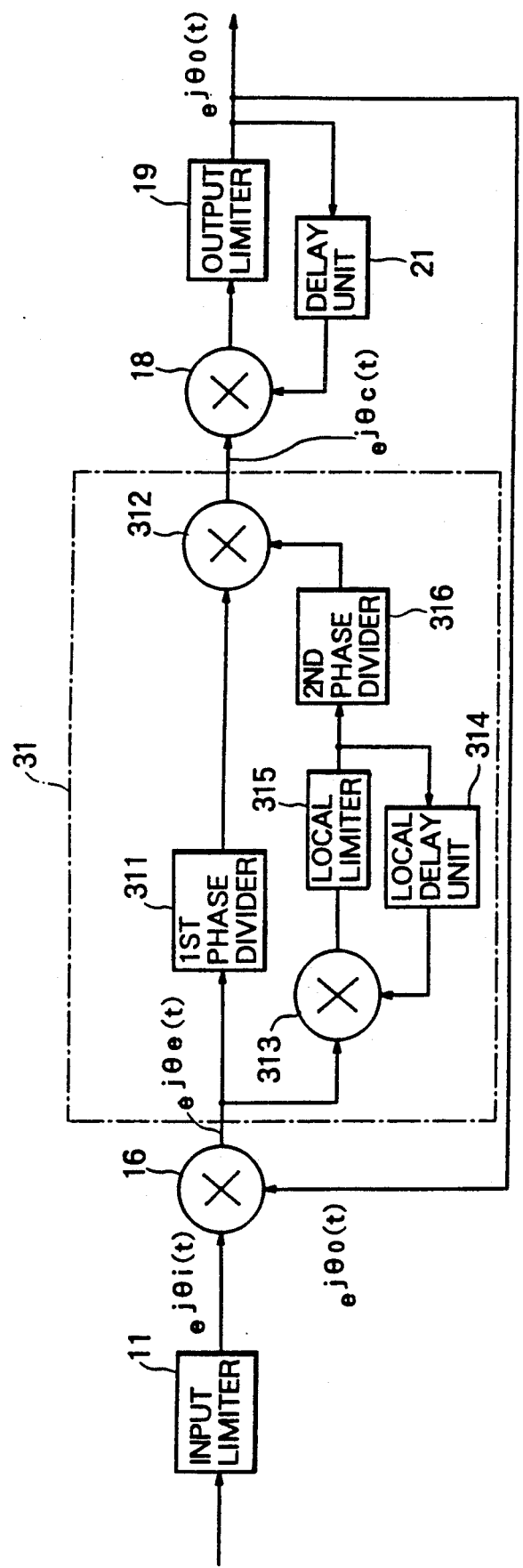
FIG. 5 is a block diagram of a phase-locked circuit according to a second embodiment of this invention.

Referring to FIG. 5, a phase-locked circuit according to a second embodiment of this invention is similar to that illustrated in FIG. 1 except that an intermediate circuit 31 is interposed between the first and the second complex multiplication circuits 16 and 18, instead of the low pass filter 17 illustrated in FIG. 1. Each element illustrated in FIG. 4 carries out a complex calculation like in FIG. 1, although each element of FIG. 5 is connected through a single line to one another.

Herein, it is to be noted that a combination of the second complex multiplication circuit 18, the output limiter 19, and the delay unit 21 are called a numerically controlled oscillator, like in FIG. 1. The input limiter 11 and the first complex multiplier 16 and the numerically controlled oscillator are operable in a manner similar to that illustrated in FIGS. 1 through 3 and will not therefore be described any longer.

In FIG. 5, the intermediate circuit 31 is operable in response to the first multiplication result signals (depicted at $e^{j\theta c(t)}$) to produce an intermediate output signal which may be depicted at $e^{j\theta c(t)}$, although the intermediate output signal is called the filter output signal (as shown by Equation (7)) in connection with FIG. 1.

The intermediate circuit 31 comprises a first phase divider 311, a first local complex multiplication circuit 312, a second local complex multiplication circuit 313, a local delay unit 314, a local limiter 315, and a second phase divider 316. As shown in FIG. 5, a combination of the second local complex multiplication circuit 313, the local limiter 315, and the local delay unit 314 is similar to the combination of the second complex multiplication circuit 18, the output limiter 19, and the delay unit 31 and therefore has a transfer function identical with the latter. At any rate, the combination of the elements 313, 314, and 315 may be called a local numerically controlled oscillator which has a transfer function of $(1/(1-z))$ and which generates a numerically controlled signal defined by the transfer function. In addition, the first and the second local complex multiplication circuits 312 and 313 are similar in structure and operation to the first and the second complex multiplication circuits 16 and 18. As a result, description of the intermediate circuit 31 may be restricted to each of the first and the second phase dividers 311 and 316.

Therefore, description will be made about a phase divider which has a division factor of N where N is a natural number.

Figure 6:
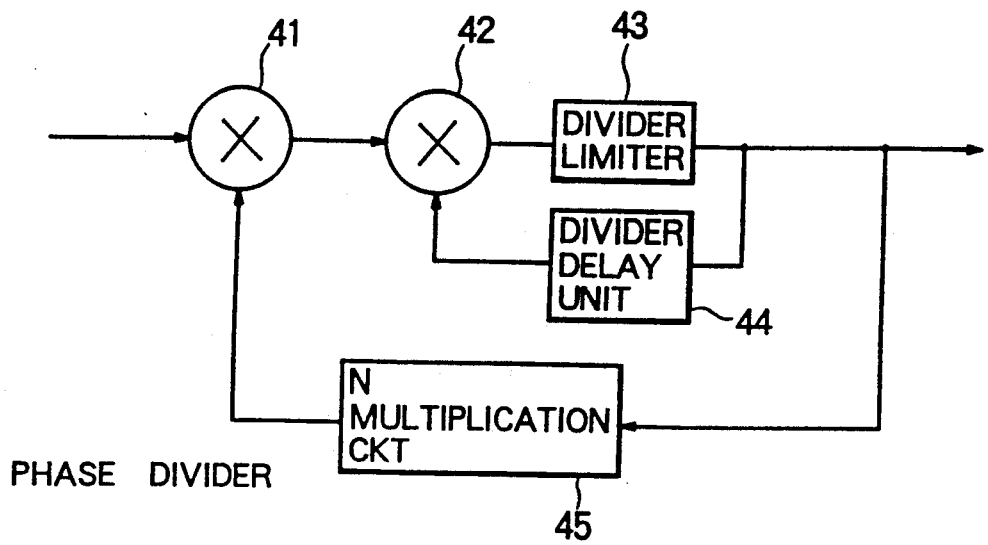
FIG. 6 is a block diagram of a phase divider which is usable in the phase-locked circuit illustrated in FIG. 5.

Referring to FIG. 6, a phase divider divides a divider input phase into a divider output phase of one N-th (namely, 1/N) and may be used as each of the first and the second phase dividers 311 and 316. It is assumed that the divider input phase of an n-th sample is represented by $\theta i(n)$ when each sample is sampled at every sample period T while the divider output phase of an m-th sample is represented by $\theta o(m)$. Specifically, the divider input phase $\theta i(n)$ is given by:

$$\theta i(n) = \omega(nT) + \theta. \tag{17}$$

The z-transform of Equation (17) is rendered into:

$$\theta i(z) = ((\omega T)/(1-z^{-1})^2) + \theta/(1/z^{-1}). \tag{18}$$

In FIG. 6, the phase divider is structured by a first divider complex multiplier 41, a second divider complex multiplier 42, a divider limiter 43, a divider delay unit 44, and an N multiplication circuit 45. A combination of the second divider complex multiplier 42, the divider limiter 43, and the divider delay unit 44 is similar in structure to the numerically controlled oscillator illustrated in FIG. 1 and therefore has a transfer function shown by Equation (12). In addition, the divider output phase $\theta o(t)$ is fed back to the first divider complex multiplier 41 through the N multiplication circuit 45.

Figure 7:
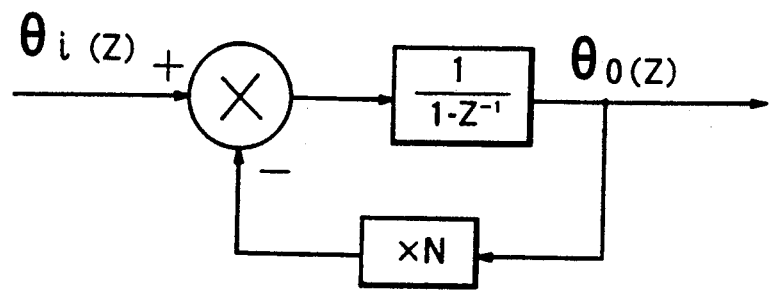
FIG. 7 shows an equivalent circuit of the phase divider illustrated in FIG. 6.

The phase divider illustrated in FIG. 6 can be represented by an equivalent circuit as shown in FIG. 7. In FIG. 7, the divider input phase and the divider output phase are subjected to the z-transform and may therefore be depicted at $\theta i(z)$ and $\theta o(z)$, respectively. As is apparent from FIG. 7, a transfer function $T(z)$ of the phase divider is given by:

$$\begin{aligned} T(z) &= \theta o(z)/\theta i(z) = 1/(N+1-z^{-1}) \\ &= 1/(N+1)/(1-(z^{-1}/(N+1))) \end{aligned} \tag{19}$$

Under the circumstances, the divider output phase is represented by the use of the z-transform by:

$$\theta o(z) = \sum_m \theta o(m) z^{-m}. \tag{20}$$

The divider output phase $\theta o(m)$ of the m-th sample is rendered into:

$$\begin{aligned}\theta o(m) &= \frac{1}{2\chi j} \oint T(z)\theta i(z) z^{m-1} dz \\ &= \frac{\omega Tm}{N} - \frac{\omega T}{N^2}\left(1 - \frac{1}{(N+1)^m}\right) + \\ &\quad \frac{\theta}{N}\left\{1 - \frac{1}{(N+1)^{m+1}}\right\} \\ &\quad \frac{1}{N}\{\omega Tm + \theta\} - \frac{\omega T}{N^2}\end{aligned} \tag{21}$$

From Equation (21), it is readily understood that the divider input phase $\theta i(n)$ is phase-divided into the divider output phase of 1/N because the second term $(\omega t/N^2)$ is quickly converged into zero, when the phase divider illustrated in FIG. 6 is used. Therefore, the first and the second phase dividers 311 and 316 may be symbolized by 1/N and 1/M when the first and the second phase dividers 311 and 316 have division factors N and M, respectively.

More specifically, such a phase divider can be practically implemented by N- and M-th power circuits which calculate N- and M-th powers of a complex divider input signal, respectively, in a known manner.

Figure 8:
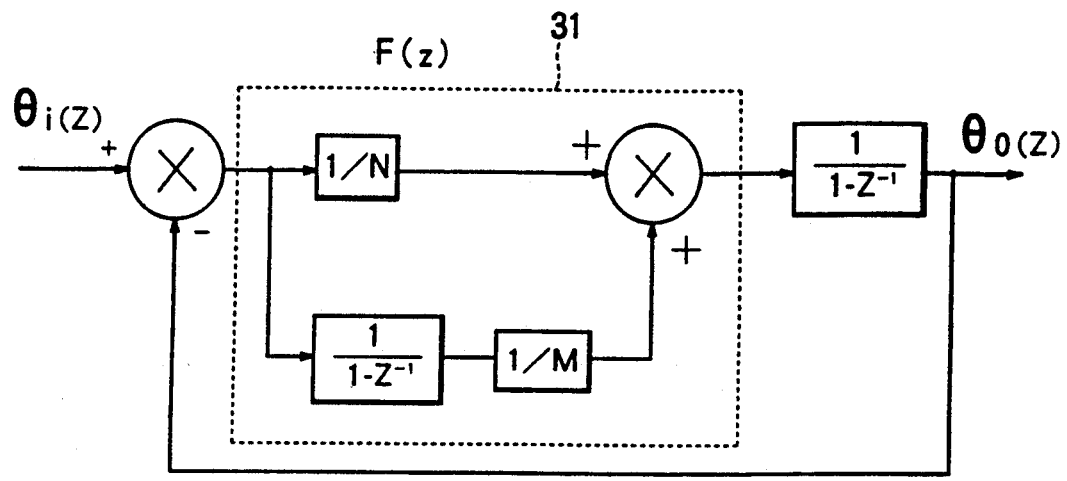
FIG. 8 shows an equivalent circuit of the phase-locked circuit illustrated in FIG. 6.

Taking the above into consideration, it is to be noted that the phase-locked circuit illustrated in FIG. 5 is represented by an equivalent circuit illustrated in FIG. 8. In FIG. 8, the intermediate circuit 31 of FIG. 5 is specified by the first phase divider 311 having the division factor of 1/N, a local numerically controlled oscillator (313, 314, and 315) having the transfer function of $1/1-z^{-1}$), the second phase divider 316 having the division factor of 1/M, and the second divider complex multiplier 312. In this event, the intermediate circuit has a transfer function F(z) given by:

$$F(z) = ((1/M)/(1-z^{-1})) + 1/N.$$

In FIG. 8, a transfer function Go(z) of an open loop is at first calculated and is given by:

$$Go(z) = F(z)(1/(1-z^{-1})). \tag{22}$$

Next, a transfer function H(z) of a closed loop is given by $\theta o(z)/\theta i(z)$ where $\theta i(z)$ is representative of the input phase and $\theta o(z)$, the output phase. Specifically, the transfer function H(z) is represented by:

$$\begin{aligned}H(z) &= G(z)/(1 + G(z)) \\ &= ((1/N)(1-z^{-1})) + \\ &\quad (1/M)/(1-z^{-1})^2) + \\ &\quad (1/N)(1-z^{-1}) + 1/M)\end{aligned} \tag{23}$$

If the sample period T is sufficiently short or the sample frequency fo is sufficiently high as compared with a time constant of the illustrated phase-locked circuit, the term of $(1-z^{-1})$ may be rewritten like a continuous type of a phase-locked circuit into:

$$1 - z^{-1} = 1 - e^{sT} \approx sT, \tag{24}$$

where T is the sample period and s, a differential operator.

Thus, when a quasi-continuous assumption is used as mentioned above in connection with Equation (23), the transfer function H(z) is rewritten into:

$$H(s) = \frac{\frac{1}{NT}S + \frac{1}{MT^2}}{S^2 + \frac{1}{NT}S + \frac{1}{MT^2}} \tag{25}$$

Equation (25) if further rewritten in a standard form into:

$$H(s) = \frac{2\zeta\omega_n S + \omega^2_n}{S^2 + 2\zeta\omega_n S + \omega_n^2}, \tag{26}$$

where $\omega_n$ is a natural angular frequency and $\zeta$ is a damping factor and where in turn $\omega_n$ and $\zeta$ are represented by:

$$\omega n = \frac{1}{\sqrt{MT^2}} = \frac{1}{\sqrt{M}} f_o \tag{27}$$

$$\zeta = \frac{1}{2} \frac{\sqrt{M}}{N} \tag{28}$$

As regards Equation (26), it is to be noted that Equation (26) specifies a pull-in condition of the phase-locked circuit, as known in the art, and always holds in the phase-locked circuit illustrated in FIG. 5 even when a frequency difference takes place between the input and the output signals of the phase-locked circuit. This means that the phase-locked circuit has a very wide pull-in range and enables quick establishment of phase synchronization even when the frequency difference between the input and the output signals is initially very large. Thus, the phase-locked circuit illustrated in FIG. 5 is realized by digital elements without an analog element.

Therefore, the illustrated phase-locked circuit is suitable for a satellite communication system which is operated under an extremely low carrier to noise (C/N) ratio.

Figure 9:
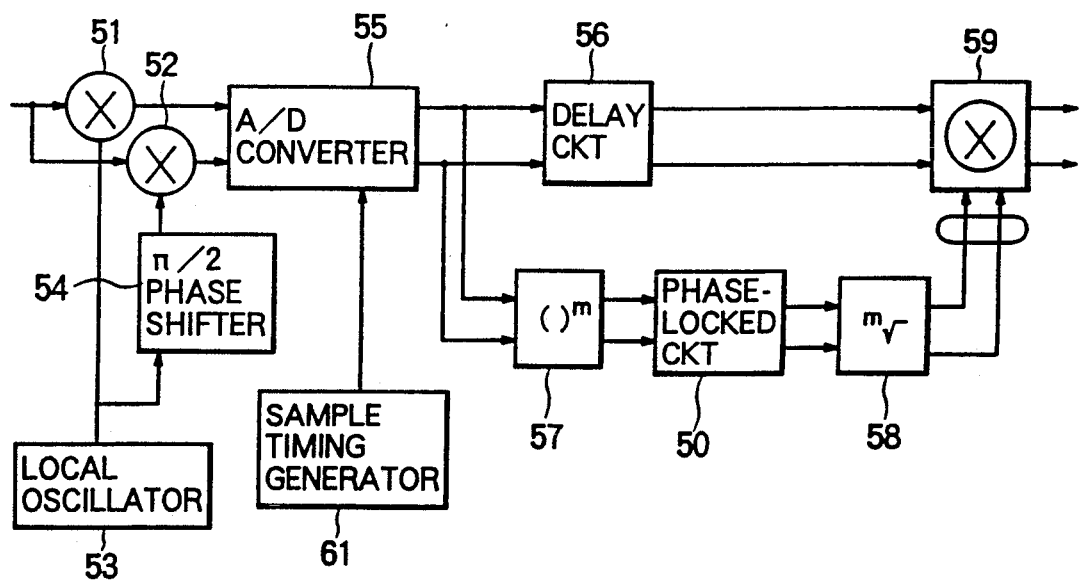
FIG. 9 is a block diagram of a coherent detector which comprises the phase-locked circuit illustrated in FIG. 6.

Referring to FIG. 9, description will be made about a coherent detector which comprises the phase-locked circuit which is illustrated in FIG. 5 and which is depicted at 50. The illustrated coherent detector is operable in response to a detector input signal to produce a detector output signal which may be a demodulated signal. Herein, it is assumed that the detector input signal includes a carrier and a sequence of sample signals which is subjected to phase shift keying (PSK) of m-phases and which appears at every sample period.

In FIG. 9, the detector input signal is supplied to first and second mixers 51 and 52 which are given a local oscillation signal of a local oscillation frequency from a local oscillator 53 directly and through a phase shifter 54 of $\pi/2$, respectively. Inasmuch as the local oscillation frequency is nearly equal to a carrier frequency of the carrier, the first and the second mixers 51 and 52 produce first and second demodulated analog signals, respectively, which are sent to an A/D converter 55. The illustrated A/D converter 55 is operable in response to a sample timing signal which is given from a sample timing generator 61 at the sample period. As a result, first and second digital signals are delivered to a delay circuit 56 on one hand and to an m multiplication circuit 57 on the other hand. The m multiplication circuit 57 calculates an m-th power of each of the first and the second digital signals to supply the phase-locked circuit 50 with first and second m-th power signals. The phase-locked circuit 50 is operated in the manner mentioned in conjunction with FIG. 5 to produce first and second phase-adjusted signals each of which has a phase equal to m-times the phase of the first and the second digital signals. The first and the second phase-adjusted signals are sent to an m-th root calculation circuit 58 to calculate an m-th root of each of the first and the second phase-adjusted signals to produce first and second m-th root signals. Each of the first and the second m-th root signal has a phase equal to each of the first and the second digital signals and represents a conjugate complex number of a complex number specified by the first and the second digital signals.

An output complex multiplier 59 is supplied with first and second delayed digital signals and the first and the second m-th root signals and multiplies the former by the latter. Consequently, the output complex multiplier 59 produces the detector output signal. While this invention has thus far been described in conjunction with a few embodiments thereof, it will readily be possible for those skilled in the art to put this invention into practice in various other manners.

What is claimed is:

1. A phase-locked circuit for use in responding to a sequence of input complex sample signals to produce a sequence of output complex sample signals phase-locked with said input complex sample signals, each of said input and said output complex sample signal sequences being produced at every sample period and being carried by a complex carrier wave divisible into a real component and an imaginary component orthogonal to said real component, said phase-locked circuit comprising:

a first complex multiplication circuit which has a pair of first input terminals, a pair of second input terminals, and a pair of output terminals and which are supplied with said input complex sample signals and a sequence of local complex sample signals through said first and said second input terminal pairs, respectively, for carrying out a first complex multiplication between said input and said local complex sample signals to produce, through said output terminal pair, first complex multiplication result signals representative of results of said first complex multiplication;

extracting means supplied with said first complex multiplication result signals for extracting phase differences between said input and said local complex sample signals from said first complex multiplication result signals to produce complex difference signals representative of complex phase differences between said input and said local complex sample signals;

a delay circuit supplied with said local complex sample signals for delaying said output complex sample signals by a single sample period to produce delayed complex sample signals;

a second complex multiplication circuit supplied with said complex difference signals and said delayed complex sample signals for carrying out a second complex multiplication between said complex difference signals and said delayed complex sample signals to produce second complex multiplication result signals representative of results of said second complex multiplication;

an output limiter supplied with said second complex multiplication result signals for limiting amplitudes of said second complex multiplication result signals to produce amplitude limited signals each of which has an invariable amplitude;

means for producing said amplitude limited signals as said output complex sample signals; and means for supplying said output complex sample signals to said delay circuit and said first complex multiplication circuit as said local complex sample signals.

2. A phase-locked circuit as claimed in claim 1, wherein said extraction circuit comprises:

a filter supplied with said first complex multiplication result signals for filtering said first complex multiplication result signals into said complex difference signals.

3. A phase-locked circuit as claimed in claim 1, wherein said circuit comprises:

a first phase divider supplied with said first complex multiplication result signals for carrying out phase division by the use of a division factor of N to produce first phase-divided signals each of which has a phase equal to one N-th of each phase of the first complex multiplication result signals where N is a natural number;

numerically controlled means which is supplied with said first complex multiplication result signals and which has a predetermined transfer function, for generating a numerically controlled signal defined by said transfer function;

a second phase divider supplied with said numerically controlled signal for carrying out phase division by the use of a division factor of M to produce second phase-divided signals each of which has a phase equal to one M-th of each phase of the numerically controlled signals where M is a natural number; and local complex multiplication means supplied with said first phase-divided signals and said second divided signals for carrying out complex multiplication between said first phase-divided signals and said second phase-divided signals to produce said complex difference signals.

* * * * *